(12) United States Patent
Seltmann et al.

(10) Patent No.: US 7,842,442 B2
(45) Date of Patent: Nov. 30, 2010

(54) METHOD AND SYSTEM FOR REDUCING OVERLAY ERRORS WITHIN EXPOSURE FIELDS BY APC CONTROL STRATEGIES

(75) Inventors: Rolf Seltmann, Dresden (DE); Bernd Schulz, Radebeul (DE); Fritjof Hempel, Langerbrueck (DE); Uwe Schulze, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 689 days.

(21) Appl. No.: 11/843,040

(22) Filed: Aug. 22, 2007

(65) Prior Publication Data
US 2008/0057418 A1 Mar. 6, 2008

(30) Foreign Application Priority Data
Aug. 31, 2006 (DE) .................. 10 2006 040 766

(51) Int. Cl.
*G03F 9/00* (2006.01)
*G03C 5/00* (2006.01)

(52) U.S. Cl. .......................... 430/22; 430/30

(58) Field of Classification Search .................. 430/22, 430/30
See application file for complete search history.

(56) References Cited

U.S. PATENT DOCUMENTS

| 6,924,879 | B2 * | 8/2005 | Ikeda ........................ 355/53 |
| 7,181,057 | B2 * | 2/2007 | Adel et al. .................. 382/144 |
| 7,295,291 | B2 * | 11/2007 | Smith et al. ................ 356/124 |
| 7,608,468 | B1 * | 10/2009 | Ghinovker et al. ........... 438/16 |

* cited by examiner

*Primary Examiner*—Christopher G Young
(74) *Attorney, Agent, or Firm*—Williams, Morgan & Amerson, P.C.

(57) ABSTRACT

By taking into consideration tool-specific distortion signatures and reticle-specific placement characteristics in an alignment control system, the control quality of sophisticated APC strategies may be significantly enhanced. Respective correction data may be established on the basis of any combinations of tool/reticles and layers to be aligned to each other, which may modify the respective target values of alignment parameters used for controlling the alignment process on the basis of standard overlay measurement data obtained from dedicated overlay marks.

19 Claims, 7 Drawing Sheets

METHOD AND SYSTEM FOR REDUCING OVERLAY ERRORS WITHIN EXPOSURE FIELDS BY APC CONTROL STRATEGIES

BACKGROUND OF THE INVENTION

1. Field of the Invention

The present disclosure relates to the field of fabrication of microstructures, such as integrated circuits, and, more particularly, to a technique for controlling alignment accuracy and pattern placement precision during lithography processes in forming and patterning stacked material layers used for fabricating microstructural features.

2. Description of the Related Art

The fabrication of microstructures, such as integrated circuits, requires tiny regions of precisely controlled size to be formed in a material layer of an appropriate substrate, such as a silicon substrate, a silicon-on-insulator (SOI) substrate, or other suitable carrier materials. These tiny regions of precisely controlled size are generated by patterning the material layer by performing lithography, etch, implantation, deposition, oxidation processes and the like, wherein typically, at least in a certain stage of the patterning process, a mask layer may be formed over the material layer to be treated to define these tiny regions. Generally, a mask layer may consist of or may be formed by means of a layer of photoresist that is patterned by a lithographic process, typically a photolithography process. During the photolithography process, the resist may be spin-coated onto the substrate surface and then selectively exposed to ultraviolet radiation through a corresponding lithography mask, such as a reticle, thereby imaging the reticle pattern into the resist layer to form a latent image therein. After developing the photoresist, depending on the type of resist, positive resist or negative resist, the exposed portions or the non-exposed portions are removed to form the required pattern in the layer of photoresist. Based on this resist pattern, actual device patterns may be formed by further manufacturing processes, such as etch, implantation, anneal processes and the like. Since the dimensions of the patterns in sophisticated integrated microstructure devices are steadily decreasing, the equipment used for patterning device features have to meet very stringent requirements with regard to resolution and overlay accuracy of the involved fabrication processes. In this respect, resolution is considered as a measure for specifying the consistent ability to print minimum size images under conditions of predefined manufacturing variations. One important factor in improving the resolution is represented by the lithographic process, in which patterns contained in the photo mask or reticle are optically transferred to the substrate via an optical imaging system. Therefore, great efforts are made to steadily improve optical properties of the lithographic system, such as numerical aperture, depth of focus and wavelength of the light source used.

The quality of the lithographic imagery is extremely important in creating very small feature sizes. Of at least comparable importance, however, is the accuracy with which an image can be positioned on the surface of the substrate. Typically, microstructures, such as integrated circuits, are fabricated by sequentially patterning material layers, wherein features on successive material layers bear a spatial relationship to one another. Each pattern formed in a subsequent material layer has to be aligned to a corresponding pattern formed in the previously patterned material layer within specified registration tolerances. These registration tolerances are caused by, for example, a variation of a photoresist image on the substrate due to non-uniformities in such parameters as resist thickness, baking temperature, exposure dose and time and development conditions. Furthermore, non-uniformities of the etch processes can also lead to variations of the etched features. In addition, there exists an uncertainty in overlaying the image of the pattern of the current material layer to the etched or otherwise defined pattern of the previously formed material layer while photolithographically transferring the image of the photo mask onto the substrate. Several factors contribute to the ability of the imaging system to perfectly overlay two layers, such as imperfections within a set of masks, temperature differences at the different times of exposure, a limited registration capability of the alignment tool and, as a major contribution to alignment errors, imperfections of the exposure tool itself, such as lens distortions, in particular in combination with respective reticle imperfections. The situation becomes even worse when different exposure tools are used for defining subsequent device layers, since then the inherent errors in the exposure system exposure tool/reticle may vary between the different tools and the different reticles. Although the same exposure tool might be used for imaging critical device layers, in practice such restrictions may not allow an efficient overall process flow in a complex manufacturing environment, which typically comprises a plurality of lithography tools and a plurality of reticles for the same device layer. As a result, the dominant criteria for determining the minimum feature size that may finally be obtained are the resolution for creating features in individual substrate layers and the total overlay error to which the above explained factors, in particular the lithographic process, contribute.

Therefore, it is essential to continuously monitor the resolution, i.e., the capability of reliably and reproducibly creating the minimum feature size, also referred to as critical dimension (CD), within a specific material layer and to continuously determine the overlay accuracy of patterns of material layers that have been successively formed and that have to be aligned to each other. For example, when forming a wiring structure for an integrated circuit, respective metal lines and vias, which connect two stacked metal regions, may have to be aligned to each other with strict process margins, since a significant misalignment may cause a short between actually non-connected lines, thereby possibly creating a fatal device defect.

In overlay metrology, typically two independent structures, that is, one structure in each layer to be printed, are formed by the specified manufacturing processes and the displacement between the centers of symmetry is determined. Frequently, so-called box-in-box marks are used, which are concentrically patterned in each of the layers and are measured in view of their displacement by an independent measurement tool, wherein typically 4-5 positions within one exposure field, preferably located in the field corners, are measured. However, a discrepancy between overlay characteristics within a single die or exposure field and the significantly larger structures of the overlay marks, which are typically located in the scribe line of the substrate, may be observed, thereby rendering measurement data obtained from the target in the scribe line and thus any control strategies based on these measurement results less reliable. Reasons for this discrepancy are imperfections of the lithography tool and in the reticles used for imaging the respective layers, as previously stated, wherein additionally the fine structures, as are typically found within the die, such as gate electrodes, shallow trench isolation (STI) structures and the like, may be imaged in a different manner compared to relatively large structures, which are typically used to form overlay marks. This pattern and size dependent phenomenon of a different degree of overlay is called pattern placement error (PPE).

Thus, modern advanced process control (APC) strategies strive to reduce respective errors on the basis of the measurement results obtained from previously measured substrates, that is, measurement results corresponding to the overlay marks located in the scribe line, in order to feed back the mismatch indicated by the measurement data for reducing the alignment error in the next substrate to be processed. APC controllers may have a predictive behavior, which is typically referred to as model predictive control (MPC), which may be convenient when the amount of available measurement data is restricted due to process requirements. For example, ideally a large number of overlay marks would be placed across the entire exposure field and would be measured to obtain a representative map of the overlay errors. However, this would require significant process time that may not be available under manufacturing conditions. Furthermore, the provision of a corresponding large number of appropriate overlay marks distributed across the entire exposure field, i.e., the reticle, may possibly result in respective design limitations for the actual product patterns. Hence, many conventional APC mechanisms rely on the measurement data obtained from the scribe line marks.

For generating appropriate manipulated values, the measured "overlay" may be separated into individual alignment parameters, such as magnification, translation, substrate rotation reticle rotation, orthogonality and the like. Consequently, a corresponding exposure tool recipe for aligning the image of a reticle with respect to a specified position of the substrate may contain respective manipulated variables that correspond to the overlay parameters specified above. The manipulated variables may represent so-called controller inputs, that is, any process parameters of the lithography tool which may be adjusted by the controller so as to obtain specified values for the above-specified overlay parameters or control variables, such as magnification, x-translation, orthogonality and the like.

However, generating respective "optimized" values for controlling the alignment activity of the exposure tool on the basis of the four corner overlay marks may not be representative for the entire exposure field, due to the reticle imperfections and the lens distortion mismatches between different exposure tools, as explained above. Rather, the optimization with respect to the corner overlay marks may even cause additional placement errors, since the controller adjustments based on the corner measurement results may be superimposed on respective fluctuations within the exposure field, which may have, due to the above-identified reasons, a significantly different behavior, which may therefore even cause an "amplification" of placement errors. Hence, in some conventional strategies, it is proposed to separate the overlay measurement into two tasks: (a) measuring the conventional overlay pattern on products; and (b) measuring in-die patterns having design rule comparable patterns formed on test substrates using corresponding test reticles. Thus, special exposure field internal effects, as pointed out above, may be taken into consideration by these techniques, the errors caused by the product reticle specific imperfections and the complex interaction thereof with the corresponding imaging performance of the specific one of the plurality of exposure tools that is actually used for imaging a specific device layer is not addressed by these techniques.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein is directed at a technique for enhancing alignment performance in lithography tools in complex manufacturing environments in which a plurality of reticles or photomasks is provided, which may be used in combination with a plurality of lithography tools. For this purpose, measurement data is generated with a relatively high degree of spatial coverage of the respective exposure fields defined by the photomasks or reticles, wherein a respective set of measurement data may be generated for a plurality of combinations of lithography tool and reticle or photomask in order to provide for the possibility of estimating the complex interaction between tool specific distortion signatures and manufacturing induced registration or placement characteristics of the respective reticles. Consequently, the respective information on the complex interaction between the tool specific and reticle specific characteristics may be encoded into the respective measurement data, which may thus be provided with higher spatial coverage compared to typical measurement positions for estimating overlay characteristics of respective device layers. Consequently, control procedures for reducing overlay errors in aligning one device layer with respect to an underlying device layer may be based on the conventional overlay measurement data, which may be collected in an efficient and fast process, thereby accounting for process specific fluctuations, while additionally the complex reticle and tool specific interactions, which are typically more stable in time, may be taken into consideration by the respective measurement data having a high spatial coverage, which may be used for a plurality of substrates so as to not unduly complicate the overall metrology and process during the manufacturing process of actual products.

According to one illustrative embodiment disclosed herein, a method comprises generating an overlay correction data for a plurality of different combinations of a first device layer and a second device layer of a microstructure device, wherein the first device layer is defined by one or more first photomasks and the second device layer is defined by one or more second photomasks. The first and second device layers are formed by using a plurality of lithography tools, wherein the overlay correction data are obtained from a first plurality of measurement positions within the first and second photomasks. The method further comprises forming a first device layer on a first product substrate using one of the first photomasks and one of the plurality of lithography tools. Furthermore, one of the second photomasks, used in one of the plurality of lithography tools, is aligned to the first device layer formed on the first product substrate by using the overlay correction data and an overlay measurement data obtained from a second plurality of measurement positions of a previously processed substrate having formed thereon the first and second layers, wherein the second plurality of measurement positions is less than the first plurality of measurement positions.

According to a further illustrative embodiment disclosed herein, a method comprises defining a map of overlay data for a plurality of lithography tool/reticle combinations for forming a first device layer and aligned thereto a second device layer of a microstructure device, wherein respective two of the lithography tool/reticle combinations are used and wherein the map is based on a first plurality of spatially distributed measurement positions. The method further comprises obtaining an overlay measurement data from a first product substrate having formed thereon the first and second device layers, wherein the overlay measurement data is obtained from a second plurality of spatially distributed measurement positions, wherein the second plurality is less than the first plurality. Finally, the method comprises controlling aligning, with respect to the first device layer formed on a second product substrate using a first lithography tool/reticle combination that comprises a reticle for the first device layer, of a second device layer to be formed by a second lithography tool/reticle combination comprising a reticle for the second device layer, wherein the controlling is based on the map of overlay data and the overlay measurement data.

According to yet another illustrative embodiment disclosed herein, an alignment control system comprises a database including a respective set of overlay correction data for each of a plurality of lithography tool/reticle combinations, wherein at least one first reticle defines a first device layer of a microstructure and at least one second reticle defines a second device layer to be aligned to the first device layer, wherein each set of the overlay correction data has a higher spatial coverage of an exposure field compared to a spatial coverage provided by overlay measurement marks formed in each of the first and second reticles. The alignment control system further comprises a controller operatively connected to the database for selectively retrieving a specified set of overlay correction data and configured to receive overlay measurement data obtained from the overlay measurement marks of previously processed substrates, wherein the controller is further configured to provide values for a plurality of alignment parameters on the basis of the overlay measurement data and the specified set of overlay correction data wherein the specified set corresponds to one of the lithography tools of the combinations used to form a first device layer and one of the lithography tools used to form the second device layer above the first device layer.

BRIEF DESCRIPTION OF THE DRAWINGS

The disclosure may be understood by reference to the following description taken in conjunction with the accompanying drawings, in which like reference numerals identify like elements, and in which.

Figure 1A:
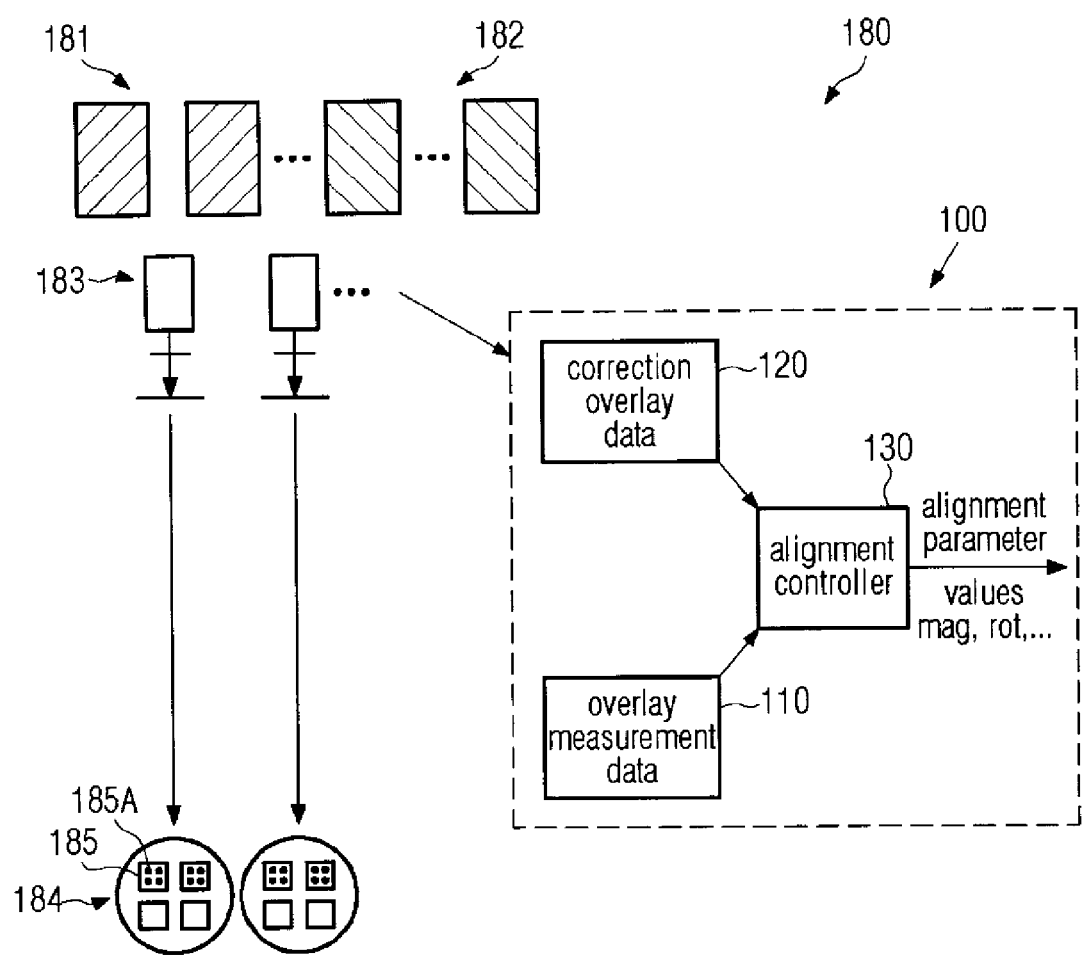
FIG. 1a schematically illustrates a control system including a database including respective sets of overlay correction data according to illustrative embodiments disclosed herein.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the subject matter disclosed herein relates to an enhanced technique for controlling an alignment process, wherein microstructure devices are formed in a complex manufacturing environment, in which a plurality of lithography tools may be used in combination with a plurality of photomasks or reticles. As previously explained, highly sophisticated alignment procedures are typically performed in an automated fashion so as to strive to reduce overlay errors between the several device layers. Since, in complex manufacturing environments, sophisticated demands with respect to high throughput are to be met, typically subsequent critical device layers requiring a high degree of accuracy with respect to alignment accuracy may not necessarily be imaged by the same lithography tool. Consequently, due to tool-specific and reticle-specific imperfections, the accuracy of overlay of respective layer portions within an exposure field may depend significantly on the corresponding reticle/tool combination used for forming the respective device layers, wherein respective spatially varying inaccuracies may not be efficiently represented by established measurement procedures for estimating the overlay accuracy of product substrates, since typically only a few measurement positions may have provided thereon respective overlay marks, typically within the scribe lines adjacent to the respective exposure fields in order to not unduly interfere with respective device patterns distributed over the entire exposure field. Consequently, respective processes for controlling the alignment process, even if highly sophisticated advanced process control (APC) strategies are used, may suffer from a reduced control quality, since particularly the reticle-specific and tool-specific systematic deviations may not be appropriately represented by the measurement data obtained from the few dedicated overlay measurement marks. The subject matter disclosed herein therefore provides additional measurement data for respective tool/reticle combinations of interest with increased spatial coverage, wherein the respective measurement data are assumed to be more stable in time so that the respective measurement data may be used for a plurality of product substrates in combination with the respective updated overlay measurements based on the dedicated overlay measurement marks. Thus, the corresponding additional measurement data of increased spatial coverage may be efficiently used in appropriately modifying the control algorithm, for instance by re-adjusting the respective target values of corresponding alignment parameter values, in order to obtain respective corrected parameter values, in which the respective information tool and reticle specific interactions is "encoded" with a high spatial coverage. Thus, the overlay accuracy within respective exposure fields may be significantly improved, although, during the actual control sequence, feedback measurement data are obtained from a low number of measurement positions corresponding to the dedicated overlay measurement marks.

FIG. 1a schematically illustrates a manufacturing environment 180 comprising a plurality of lithography tools 183, which may represent any advanced photolithography devices, such as steppers, step and scan devices and the like, which are appropriately configured to image a specified exposure field on a previously formed device layer. Furthermore, a plurality of first reticles or photomasks 181 may be provided which may represent a specific device layer, that is, the first reticles or photomasks 181 may have formed therein a respective pattern in order to create respective device features, such as conductive lines, gate electrodes and the like. Furthermore, at least one second plurality of reticles or photomasks 182 may be provided, which may represent a respective pattern that has to be precisely aligned to the pattern represented by the first reticles or photomasks 181. It should be appreciated that, typically, a plurality of different reticles or photomasks corresponding to respective device layers are provided in the manufacturing environment 180 wherein, for convenience, any further types of reticles and photomasks are not shown. Furthermore, the manufacturing environment 180 may comprise an alignment control system 100 that is operatively connected to the lithography tools 183 and is further configured to receive respective overlay measurement data from substrates 184 that have been processed by the plurality of lithography tools 183 on the basis of the reticles or photomasks 181, 182. It is to be noted that the terms "reticle" and "photomasks" may be used herein as synonyms, wherein it should be appreciated that, in sophisticated applications, reticles are typically used which represent an exposure field 185 that has to be repeatedly imaged on the respective substrates 184 in order to form respective microstructure devices thereon. Consequently, respective measurement data obtained from dedicated overlay measurement marks 185A, for instance positioned substantially at the corners of the respective exposure fields 185, may be obtained by the system 100 by means of a respective interface 110.

Furthermore, the system 100 may comprise a database 120 which may contain overlay correction data or any other process-related data for obtaining therefrom the respective overlay correction data, which have encoded therein overlay information relating to specific inner exposure field specific interactions between corresponding reticles 181, 182 and respective ones of the lithography tools 183. Thus, the respective information stored in the database 120 may include a correlation between reticle specific registration or placement characteristics in combination with lithography tool specific distortion signatures. The database 120 and the interface 110 are connected to a respective alignment controller 130 which is configured to determine appropriate alignment parameter values, such as magnification, rotation, translation in x-direction, translation in y-direction and the like, on the basis of information retrieved from the database 120 and obtained from the interface 110. The correspondingly determined parameter values for respective alignment parameters may be supplied to a respective one of the photolithography tools 183 in order to optimize the alignment process performed therein.

Figure 1B:
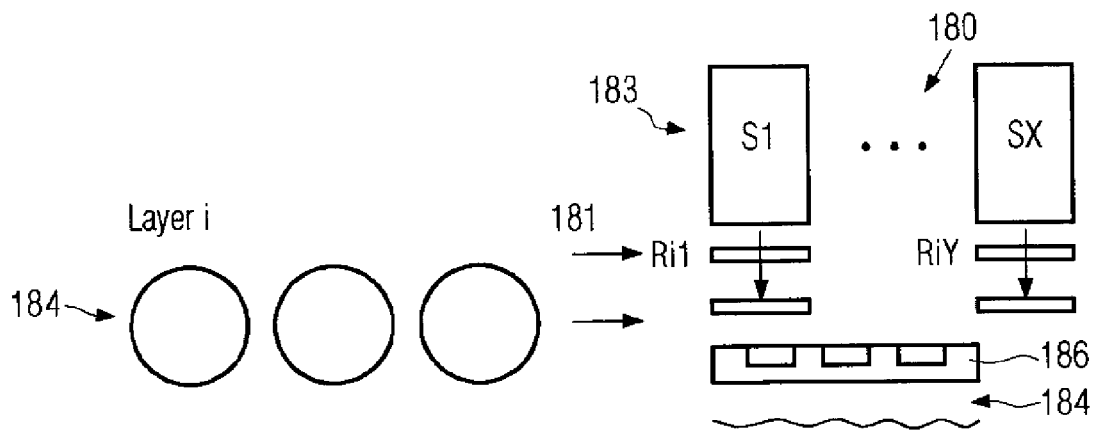
FIGS. 1b-1c schematically illustrate a plurality of lithography/reticle combinations used for forming a specified device layer.

The operation of the manufacturing environment 180 will now be described with further reference to FIGS. 1b-1d. FIG. 1b schematically illustrates the plurality of substrates 184 that are to be processed by the plurality of lithography tools 183 in order to form a first device layer 186 on the substrate 184. The first device layer 186 may represent any critical device layer, such as a layer including metal lines or any other device regions, to which other contacts are to be precisely aligned. During processing of the substrates 184, individual substrates or groups thereof may be supplied to one or more of the lithography tools 183, which are also equipped with respective reticles of the plurality 181, which are indicated as Ri1-RiY, wherein the first layer 186 is to represent a specific device layer i. Depending on the complexity of the manufacturing environment 180 and the corresponding scheduling regime, a plurality of lithography tools, indicated as S1-SX, may be used to form the respective first layers 186 wherein, as previously explained, the corresponding characteristics of the features in the first layer 186 may depend significantly on tool and reticle specific characteristics, such as manufacturing specific registration characteristics, i.e., the actual position of device patterns within the respective reticle and the like. Tool specific distortion signatures may be understood as a spatially varying imaging behavior of the respective lithography tool, which may vary between the individual lithography tools. It should be appreciated that these tool and reticle specific characteristics may vary over time, wherein a corresponding drift is, however, significantly less compared to other components influencing the alignment process that is to be performed prior to actually exposing the respective substrates 184 through the respective reticles 181.

Figure 1C:
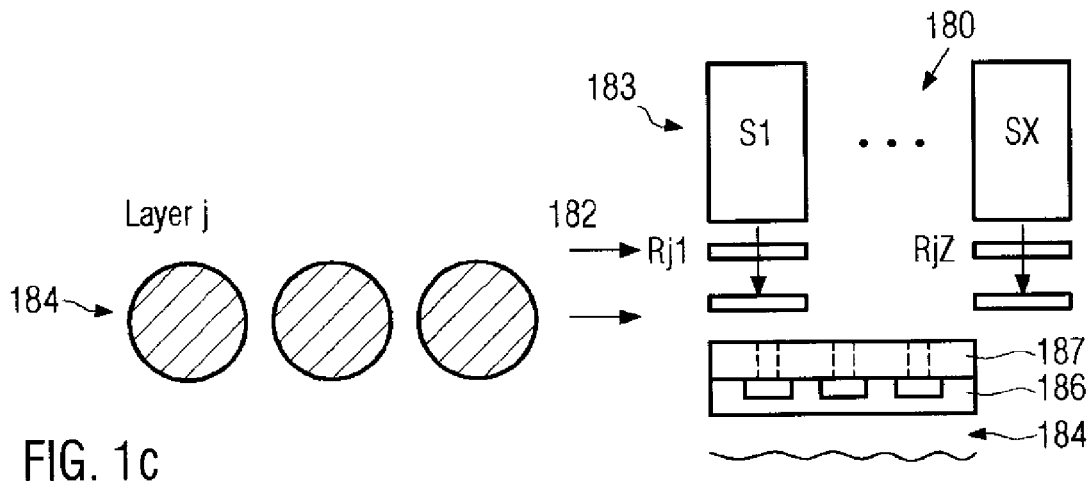

FIG. 1c schematically illustrates the substrate 184 in a further advanced process stage, wherein the substrates 184 having formed thereon the first device layer 186 are to be processed by the plurality of lithography tools 183 or at least a portion thereof, on the basis of the second reticles 182 or at least some of the second reticles 182, indicated as Rj1-RjZ to receive a second device layer 187. Thus, the respective second layer 187 is to be formed on the respective first layers 186 with a required high degree of overlay accuracy. Also, in this case, a respective interaction between the corresponding reticle specific registration characteristics and the corresponding tool distortion signatures may lead to respective characteristic overlay and placement errors of the second layers 187 with respect to the first layers 186, since the corresponding pattern distortion created by respective lithography tool/reticle pairs is superimposed on the corresponding pattern distortions created by the respective lithography tool/reticle pairs used for forming the second layers 187, which is also generally indicated as layer j. In the present example described above it may be assumed that the layers i and j, i.e., the layers 186 and 187, may represent critical device layers so that the alignment of the second layer 187 to the first layer 186 has to be performed with high precision. Consequently, the respective tool specific and reticle specific characteristics may be obtained by providing respective measurement data that provide a high degree of spatial coverage for a respective exposure field 185 in order to obtain information on the degree of pattern distortion generated by a respective pair of lithography tools/reticles. Consequently, during the alignment procedure controlled by the system 100 during processing of the substrates 184 according to FIG. 1c, this additional information may be used in establishing respective parameter values for the alignment process in order to increase the overlay accuracy across the entire exposure field 185.

Figure 1D:
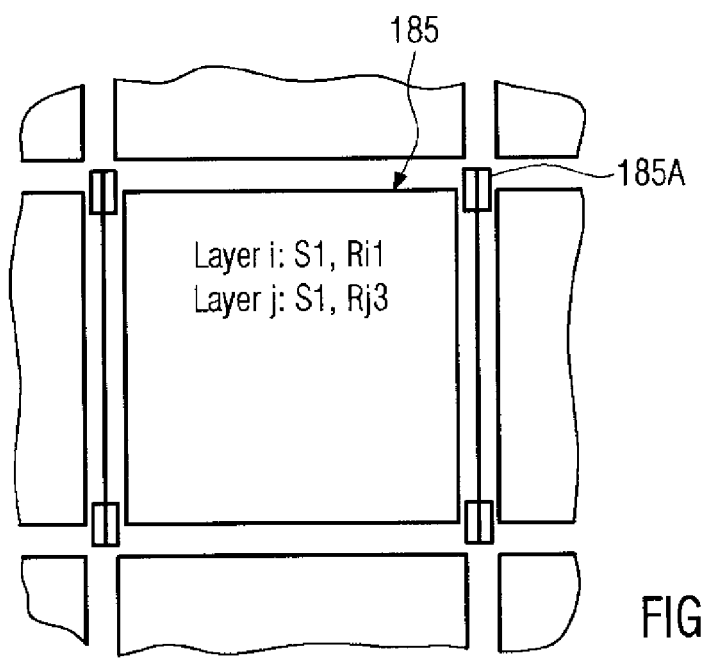
FIG. 1d schematically illustrates a top view of a plurality of exposure fields for a combination of two subsequent device layers.

FIG. 1d schematically illustrates a corresponding exposure field 185, that is, a portion of a respective substrate 184 having formed thereon the layers i and j created by a respective pair of lithography tools/reticles in accordance with the process flow in the manufacturing environment 180. As previously explained, the alignment control may be accomplished on the basis of respective measurement data obtained from the corresponding dedicated overlay measurement marks 185A of previously processed substrates, thereby efficiently providing process information relating to process characteristics that may be "detected" on the basis of the overlay measurement mask 185A. Furthermore, in the example shown, the exposure field 185, i.e., the stacked layer portions of the layers 186 and 187 for the substrate under consideration, may have been formed by lithography tool S1 using reticle 1 for the first layer 186 and by the lithography tool S1 using reticle R3 for forming the second layer 187. Thus, a corresponding set of correction data for these tool/reticle combinations may be retrieved from the database 120 in order to provide the appropriate parameter values for the alignment process for the substrate shown in FIG. 1d.

Figure 1E:
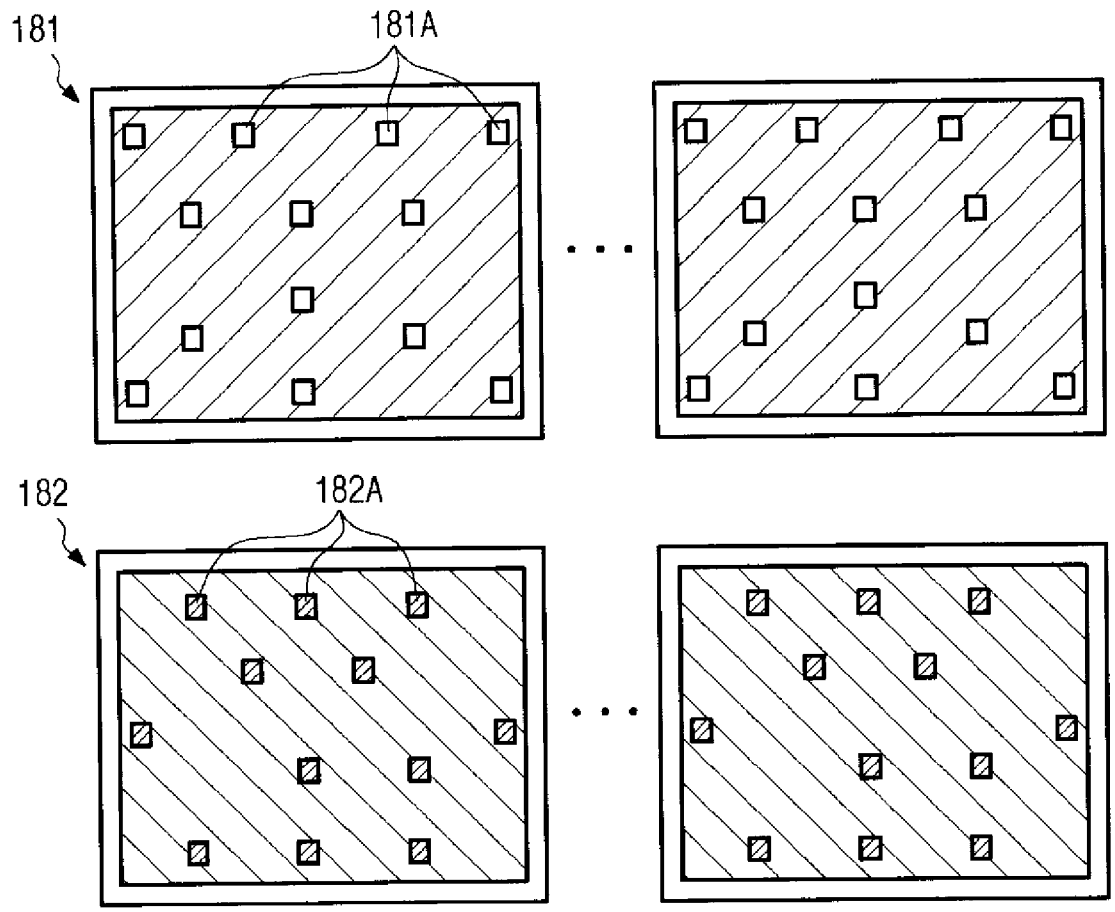
FIGS. 1e-1f schematically illustrate spatially distributed measurement positions for estimating reticle specific registration or placement characteristics and lithography tool distortion signatures with high spatial coverage according to illustrative embodiments disclosed herein.

FIG. 1e schematically illustrates the reticles 181 and 182 configured to provide respective reticle specific information with a high degree of spatial coverage according to illustrative embodiments disclosed herein. The reticles 181 may comprise respective measurement positions 181A, which may be represented by appropriately designed marks, which may have significantly different dimensions and a different configuration compared to the dedicated overlay measurement marks 185A. For example, a respective mark having a significantly reduced size compared to the measurement marks 185A may be provided at a plurality of positions across the entire exposure field 185, wherein an undue interference with actual device patterns of the respective layer represented by the reticles 181 may be substantially avoided. In other illustrative embodiments, the respective plurality of measurement positions 181A may be defined on the basis of actual device patterns, when appropriate measurement regimes are available for determining respective placement or registration characteristics for these dedicated device patterns. In this case, reticles of standard design may be used in combination with the subject matter disclosed herein. Respective measurement data on the basis of the plurality of measurement positions 181A may be obtained for all reticles 181 of interest, that is, for all reticles 181 that may actually be used in the manufacturing environment 180. The illustrative pattern of measurement positions 181A is provided by way of example only, as the number and pattern of the positions 181A may vary depending upon the particular application.

Similarly, respective measurement positions 182A may be defined for the plurality of second reticles 182 in order to obtain respective registration characteristics of each of the reticles 182. Also, in this case, the positions 182A may be represented by specifically designed marks, which may be efficiently used in combination with standard measurement techniques for estimating registration characteristics of reticles and/or dedicated device patterns may be used, as is explained above.

Figure 1F:
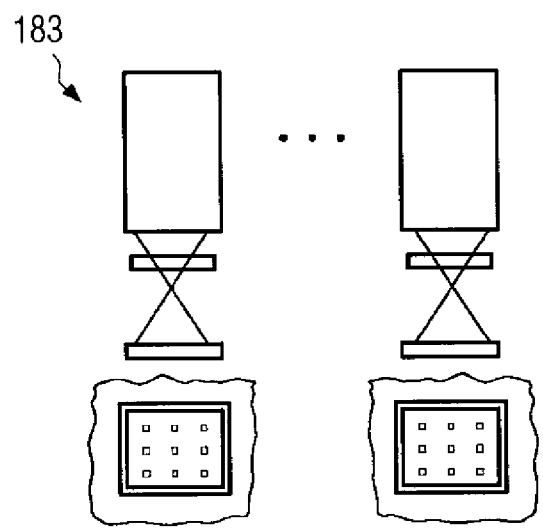

FIG. 1f schematically illustrates the lithography tools 183 during a process for creating respective distortion signatures or any other tool specific characteristics. For this purpose, dedicated test substrates or specific product substrates may be prepared and may be measured with respect to a distortion of respective patterns formed thereon in order to obtain a corresponding signature, i.e., a characteristic behavior, of the imaging performance of the respective exposure tool. However, any other measurement techniques may also be used, which allow the determination of imaging characteristics of the respective exposure tool at a plurality of specific measurement positions within a corresponding exposure field created by the exposure tool. The generation of respective measurement data having a high spatial coverage for a respective exposure field by collecting respective reticle data independently from respective tool data, as is for instance described with reference to FIGS. 1e and 1f, may provide a high degree of flexibility in appropriately updating or adapting the corresponding overlay correction data to the database 120. For instance, when a new reticle is obtained in the manufacturing environment 180, the respective reticle may be measured appropriately on the basis of techniques described above, and a corresponding set of correction data for any desired combination of exposure tool/reticle may be established on the basis of the newly-gathered reticle data and the previously obtained tool data. The same holds true for the lithography tools 183, wherein respective tool data may also be collected after a new installation, a maintenance and the like or, in other cases, during respective idle times in the manufacturing environment 180, respective tool data may be generated in order to update the corresponding database entries.

In other illustrative embodiments, the respective measurement data of high spatial coverage may be obtained by forming respective pairs of reticle/exposure tools and determining respective overlay data at a plurality of positions within the respective exposure field, such as the positions 181A, 182A (FIG. 1e), thereby possibly increasing the reliability of the respective measurement data. In still further illustrative embodiments, respective overlay errors within the exposure field may be determined with high spatial coverage on the basis of actually formed first and second device areas, such as the layers i and j previously described, for any combinations of reticle and exposure tool of interest. Although increased measurement effort may have to be made in order to establish the respective overlay error data for any desired combination of lithography tool/reticle and reticle layer pairs, the accuracy and thus the reliability of the respective measurement data may be even further enhanced.

Figure 1G:
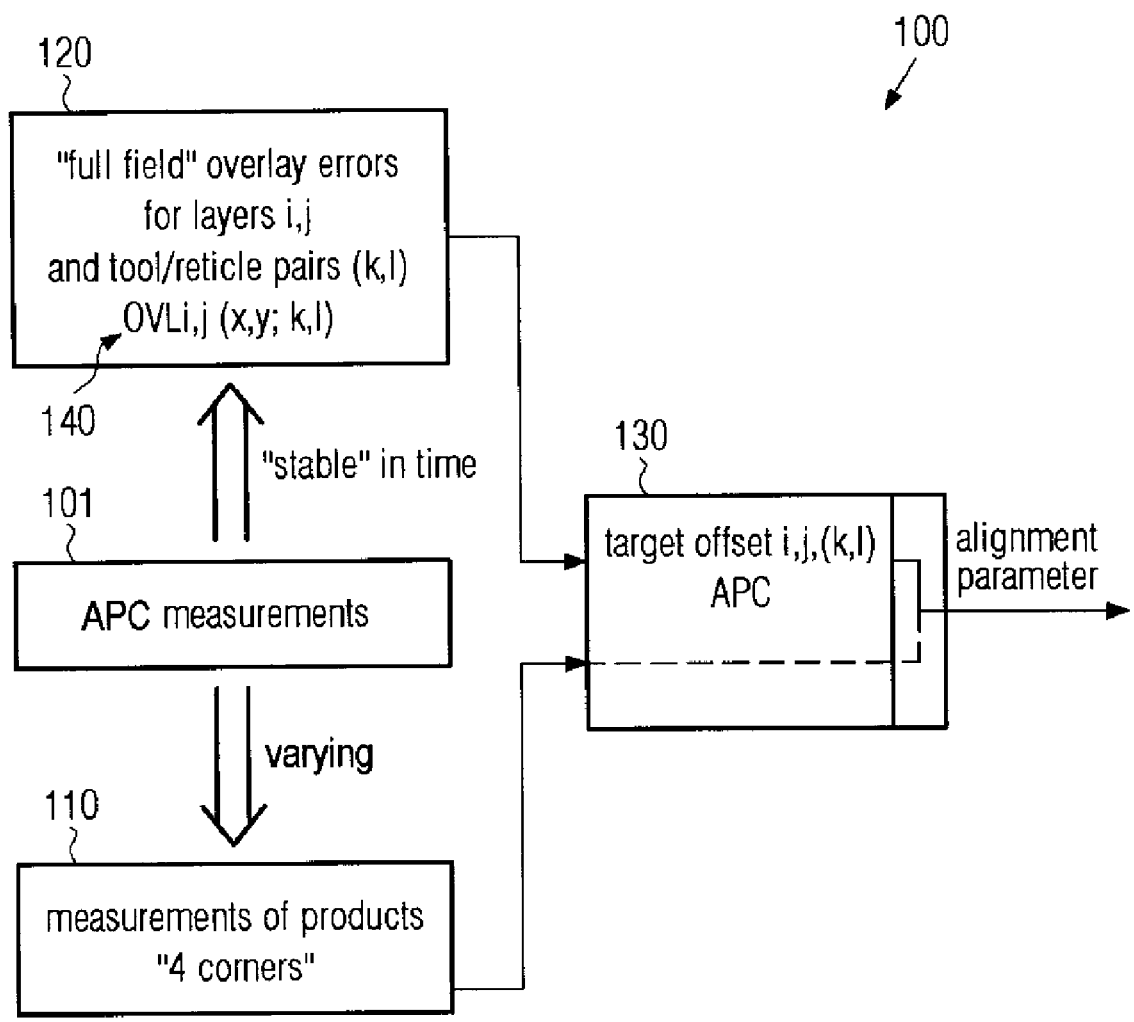
FIG. 1g schematically illustrates a control scheme according to one illustrative embodiment disclosed herein.

With reference to FIGS. 1g-1k respective control strategies performed by the control system 100 as shown in FIG. 1a will now be described in more detail with reference to further illustrative embodiments. FIG. 1g schematically illustrates a control scheme of the system 100. In this scheme, it may be assumed that measurement data 101 that are available for the alignment controller 130 may be separated into two contributions, as previously explained. That is, the measurement data 101 may comprise respective "in line" measurement data obtained in a standard fashion on the basis of the respective dedicated overlay measurement marks, such as the marks 185A, which are also indicated as "four corner" measurement results. These measurement results may represent respective fluctuations in the manufacturing process, such as wafer distortion, temperature variations and the like, which may affect the corner portions of the respective exposure fields in a substantially similar manner as any central portions thereof. In contrast thereto, another portion of the measurement data 101 may comprise respective components of reduced variability in time, which may be indicated as "stable" in time, wherein it should be appreciated that nevertheless a variation of influences determining the corresponding "stable" measurement data may nevertheless occur, however, in a significantly reduced degree compared to the "four corner" measurement data. Due to the relatively stable behavior of the respective measurement data, the data may be used over extended process periods, thereby not unduly increasing the overall measurement effort while nevertheless significantly enhancing the process quality of the respective alignment processes. Based on the corresponding "stable" measurement data, appropriate overlay correction data may be established and may be stored in the database 120. For convenience, such data may be referred to as "full field" overlay data in order to indicate that the corresponding measurement data provide a high spatial coverage with respect to the exposure field compared to the "four corner" measurement data. Thus, in some illustrative embodiments, the respective "full field" overlay data may comprise a respective map indicated as OVLi,j (x,y;k,l) 140, which may include the respective tool and reticle specific characteristics for specified device layers i, j and tool/reticle pairs (k, l). The respective map of overlay data may be provided in the form of a corresponding "grid" of data values characterizing a specific overlay property, such as an overlay error at the specific position (x,y), wherein respective data values may be established on the basis of actual measurement results in combination with interpolation, if a higher degree of spatial resolution is required for the respective values, for instance for performing the respective calculations during the control process. In other illustrative embodiments, the corresponding "full field" measurement data may be processed in accordance with any appropriate technique, such as processes as will be described later on in more detail, so as to obtain appropriate correction values that may be stored within the database 120 and which may be directly used as respective target offset values for a corresponding control algorithm implemented in the alignment controller 130.

Thus, during operation of the system 100, the alignment controller 130, which may be provided in the form of a sophisticated APC system, may receive the corresponding "four corners" measurement data from the interface 110 and may retrieve appropriate data from the database 120, for instance in the form of an overlay data map, as previously explained, or in any other further manipulated form or even in the form of the initially created measurement data of high spatial coverage, wherein the data of the database 120 may relate to the tool/reticle combinations used for the layers i, j. Based upon these two data sets, the controller 130 may provide appropriate parameter values for alignment parameters, wherein, in one illustrative embodiment, the respective target values are equivalently the corresponding difference between actually measured overlay errors obtained from the "four corner" measurement data and the corresponding target value thereof may be adjusted according to an offset determined by the "stable" measurement data, thereby incorporating the information encoded therein into the respective control algorithm performed by the alignment controller 130.

Figure 1H:
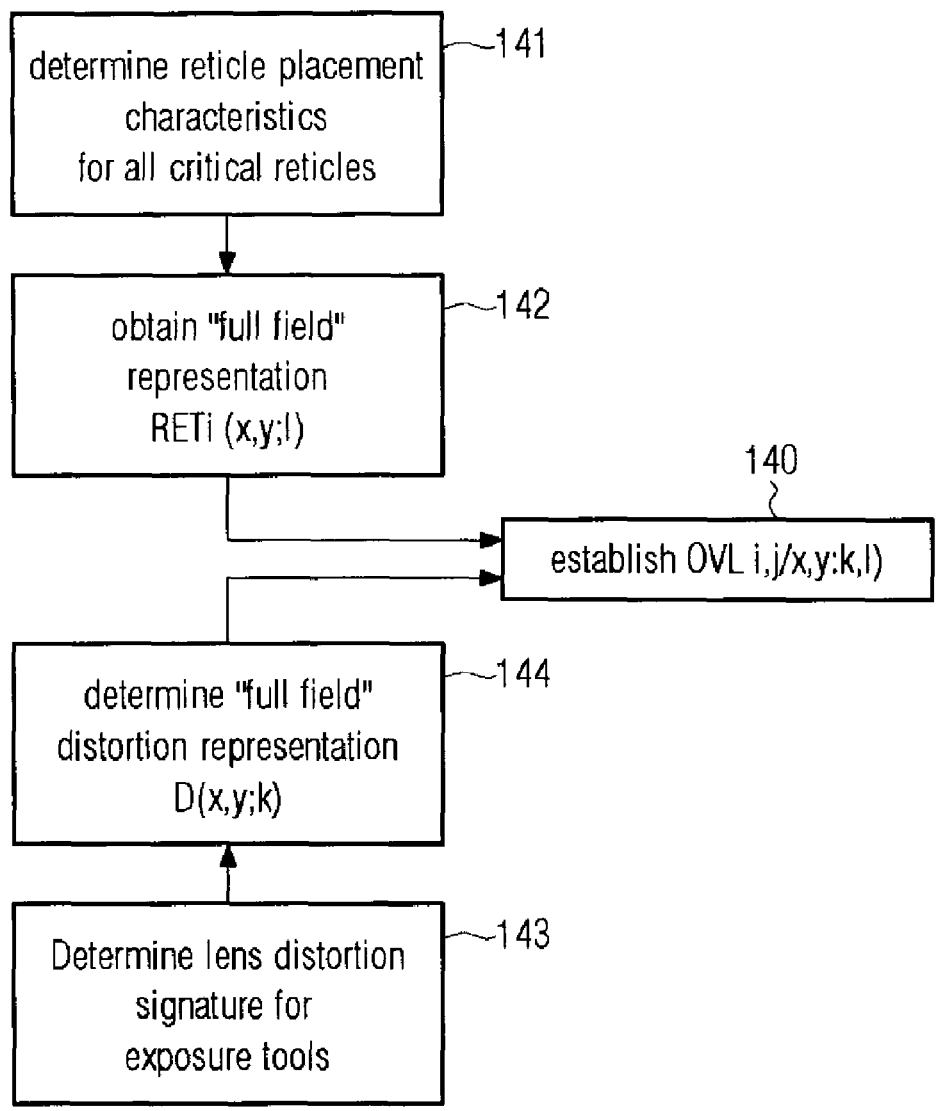
FIG. 1h schematically illustrates a control scheme for determining a two-dimensional map of overlay data according to one illustrative embodiment disclosed herein.

FIG. 1h schematically illustrates a process flow for obtaining the map of overlay data 140 according to one illustrative embodiment disclosed herein. In this embodiment, the "stable" measurement information, that is, the portion of the measurement data 101 relating to tool and reticle specific characteristics, may be obtained independently for the reticles and the lithography tools, as is for instance described with reference to FIG. 1c. Thus, in block 141, reticle placement characteristics may be determined for any desired critical reticle, for instance for each reticle to be used in the manufacturing environment 180 for a specific device layer. With respect to appropriate techniques for obtaining the desired information with a required degree of spatial coverage of the corresponding reticle, it may be referred to the embodiments as described with reference to FIG. 1c. According to block 142, a "full field" representation, also indicated as RETi (x,y;l), may be obtained for each reticle 1 for a specific device layer i, wherein it should be understood that the "full field" representation may represent a map of closely spaced data points, which may represent measurement values when a corresponding high number of measurement values is available, or which may represent corresponding calculated or interpolated data points, wherein the degree of resolution of the corresponding map may be selected on the basis of process requirements. Similarly, in block 143, a corresponding lens distortion signature or any other characteristic of an exposure tool of interest may be determined, as is for instance previously described with reference to FIG. 1d. In block 144, a "full field" distortion representation D(x,y;k) may be determined for each exposure tool k of interest, wherein, in one illustrative embodiment, the distortion representation or map D may be obtained on the basis of available models of the alignment process. For instance, equation 1:

$$d_x = T_x + M_x x - R_x y + e_x$$
$$d_y = T_y + M_y y - R_y y + e_y \qquad (1)$$

describes an intra field model for step and scan systems, wherein respective alignment parameters describe a set of overlay measurement data at a respective measurement position (x,y), wherein the corresponding parameters T, M, R and e represent corresponding parameters translation, magnification, rotation and a residual error in the corresponding direction indicated by the sub index. Thus, based on the corresponding measurement data $d_x$, $d_y$ and by using appropriate optimization techniques, such as least square techniques, the residual placement errors $e_x$, $e_y$ may be determined and may represent the corresponding distortion D for the exposure tool k at the measurement site (x,y). The corresponding "full field" representation RET and D may, according to one illustrative embodiment, be combined in order to obtain a respective total inner field overlay data, wherein both components may be added according to the following equation:

$$RETi(x,y;l)M + D(x,y;k) = OVLi(x,y;l,k) \qquad (2)$$

wherein OVLi(x,y;l,k) indicates the total inner field placement error in the layer i formed by reticle 1 and the exposure tool k. For convenience, corresponding combinations of exposure tool/reticle (l,k) may be indicated by index Ci, wherein Ci corresponds to C1 . . . CN, where N indicates the total number of combinations of interest. Based on the respective total placement error for each layer, a "non-correctable" overlay error may be obtained in order to determine the map 140, as also shown in FIG. 1g. For this purpose, in one illustrative embodiment, the respective total placement errors according to equation (2) for two subsequent layers of interest may be subtracted. For instance, the initially formed layer, indicated as layer i, may be considered as a reference layer having a certain degree of placement error as described by the corresponding map OVLi(x,y;Ci) since, in principle, the placement error of the "reference" layer i may be reduced when the next layer j may create a respective placement error in the same direction at a specific position (x,y). Consequently, by defining a corresponding difference between these two contributions of both layers i, j, a corresponding "non-correctable" placement error may be defined, which may be provided in the form of the map 140. As previously explained, the process flow as described in FIGS. 1e and 1f may provide a high degree of flexibility in separately obtaining respective "full field" representations for the reticles of interest and for the respective distortion characteristics of any exposure tool of interest. Furthermore, since the respective collection of the respective measurement data may be performed in a highly decoupled manner, the corresponding measurement activities may be readily coordinated with respect to the overall process requirements in the manufacturing environment 180. For instance, if an update of the "stable" overlay correction data is required, a corresponding measurement process may be performed with respect to tool utilization, reticle availability and the like, without unduly affecting the overall process flow in the environment 180.

Figure 1I:
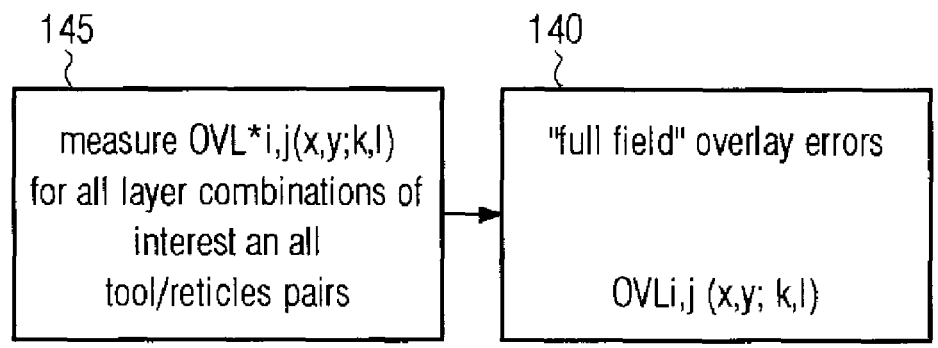
FIG. 1i schematically illustrates the generation of a two-dimensional map of overlay data according to other illustrative embodiments including additional measurement activities.

FIG. 1i schematically illustrates a process flow in which the respective map of overlay data 140 may be obtained in a more "direct" manner by creating an increased amount of respective overlay data. In the illustrative embodiment shown in FIG. 1i, a respective reduced map OVL*i,j(x,y;Cn) may be directly measured for all layer combinations of interest and for all tool/reticle pairs of interest. For this purpose, the respective reticles and tools may be used in forming the respective device layers i, j and the corresponding overlay errors may be determined in a plurality of intra field positions (x,y), wherein, depending on the density of measurement points, an appropriate data manipulation may be performed, for instance interpolation and the like, in order to obtain the "full field" map 140 having the desired spatial resolution. As previously explained with reference to FIG. 1d, the map 145 may be obtained in other illustrative embodiments by directly measuring the resulting total placement errors OVLi(x,y;Cn), OVLj(x,y;Cn) for each layer i, j of interest, and the corresponding map 145 may be obtained by subtracting the respective layer contributions, i.e., OVLj(x,y;Cn)−OVLi(x,y;Cn), as is previously described with reference to the map 140. In this way, enhanced accuracy of the corresponding overlay data 140 may be achieved, while only moderately increasing the amount of measurement activity required.

Figure 1J:
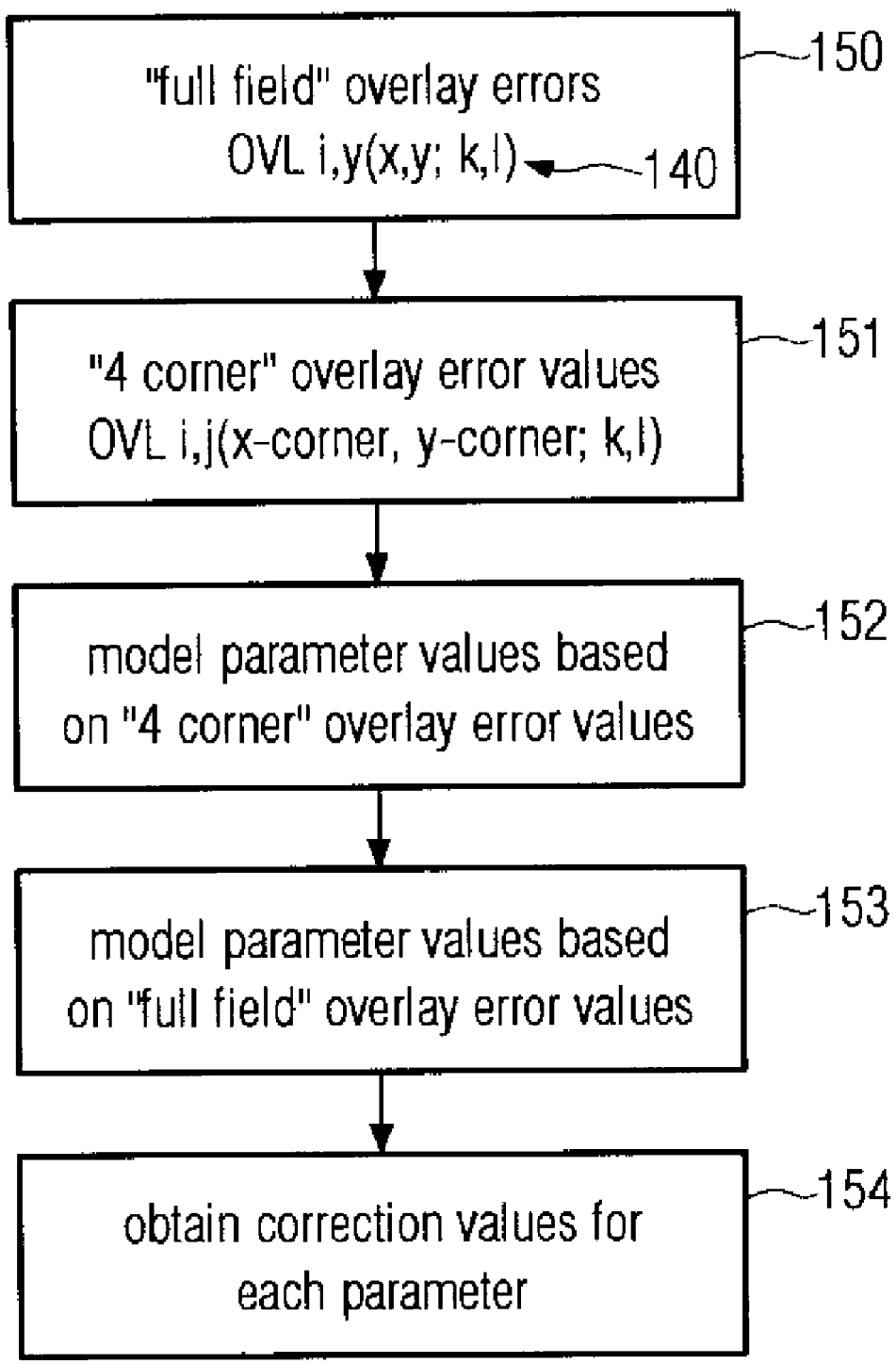
FIGS. 1j-1k schematically illustrate flowcharts illustrating a process for obtaining correction coefficients according to various illustrative embodiments disclosed herein.
Figure 1K:
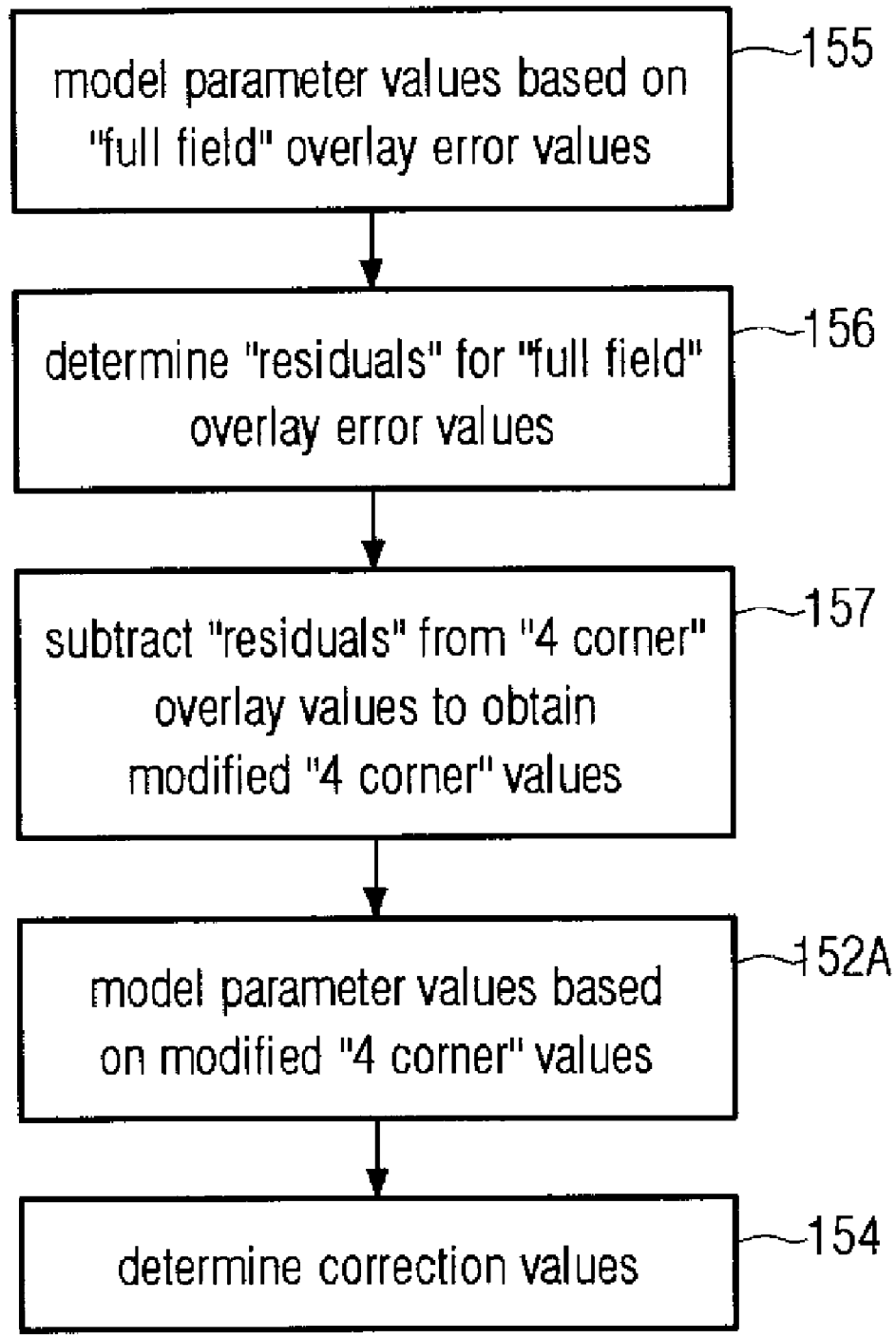

With reference to FIGS. 1j and 1k, respective process flows according to further illustrative embodiments are now described, in which respective correction values for the alignment parameters provided by the alignment controller 130 may be obtained on the basis of the "full field" overlay data 140.

In FIG. 1j, the "full field" overlay data 140 of block 150, for instance the map OVLi,j(x,y;Cn), Cn representing one of the combinations of a reticle 1 and a tool k, may be used in block 151 in order to determine respective "four corner" overlay error values at the respective measurement positions, at which respective "four corner" measurement data may also be obtained on the basis of respective dedicated overlay measurement marks, such as the marks 185A. A respective measurement position may be referred to as (x-corner, y-corner). It should be appreciated, however, that the corresponding actual measurement positions may vary, depending on the positions of the respective dedicated overlay measurement marks. In block 152, respective parameter values for the corresponding alignment parameters may be obtained on the basis of a respective model and the corresponding overlay error values determined in step 151. For example, a corresponding model as is typically used in the alignment controller 130 for determining updated parameter values for the respective parameters may be used, wherein the corresponding "measurement values" may be represented by the corresponding "four corner" data created in step 151. For instance, a corresponding model and a respective optimization technique as described with reference to equation (1) may be used in order to obtain a corresponding parameter value.

In block 153, a corresponding process may be performed for obtaining appropriate parameter values, wherein the modeling may be based on the "full field" overlay error values 140 in order to obtain corresponding parameter values representing the influence of the intra field characteristics on the corresponding process for obtaining updated parameter values. For example, respective parameter values may be calculated for a plurality of intra field positions and the corresponding parameter values may be averaged in any appropriate manner. In other cases, a desired averaging of the input "measurement data" may be performed, that is, the map 140 may be averaged across a specified portion or across the entire exposure field, thereby creating the input "measurement data" for the modeling process, and thereafter the modeling process may be performed on the basis of the averaged input data. In any case, the corresponding parameter values obtained in blocks 152 and 153 may differ from each other, since the parameter values obtained in block 152 reflect the corresponding overlay characteristics at only a few positions, such as the four corner positions, while the parameter values obtained in block 153 take into consideration a significant portion of the information encoded into the map 140, which is itself based on a plurality of intra field measurement data. Consequently, the difference between the "four corner" parameter values of block 152 and the "full field" parameter values of block 153 describe the effect of the tool and reticle specific characteristics on the control algorithm under consideration, which is performed on the basis of the reduced number of measurement positions, i.e., the "four corner" positions. Consequently, based on the respective parameter values, an appropriate offset for the actual control process may be established in order to compensate for the non-consideration of intra field effects during the actual alignment control process. Thus, in block 154, an appropriate correction value is established for each parameter used by the alignment controller 130. For example, in one illustrative embodiment, the difference of the respective parameter values obtained in blocks 152 and 153 may be used as a corresponding correction value. Equation (3) illustrates a representative example for one alignment parameter, such as the x-translation, wherein a corresponding offset value $T_X CORR$ is calculated on the basis of the corresponding parameter values obtained in block 153, i.e., in equation (3) the first term on the right side, and the corre sponding parameter value obtained in block 152, i.e., the second term in equation (3).

$$T_x corr = T_x(OVLj,i(x,y)) - T_x(OVLj,i(x\text{-corner},y\text{-corner})) \quad (3)$$

Thus, during operation of the alignment system 100, the controller 130 may retrieve the corresponding corrected parameter value from the database 120, or the controller 130 may perform the respective steps of blocks 151-154 at any appropriate point in time on the basis of appropriate overlay data having a high spatial coverage, such as the overlay map 140. It should be appreciated that the corresponding activities for obtaining the appropriate parameter value corrections may be performed at any time, as soon as respective measurement data having the high spatial coverage are available. Consequently, the corresponding correction value itself, or any intermediate data thereof, may be stored in the database 120 and may be retrieved from the controller 130 when required for performing a corresponding control activity.

FIG. 1k schematically illustrates a process flow for obtaining appropriate correction values for the alignment parameters according to still another illustrative embodiment. Also, in this case, the process may be based on an appropriate overlay data map, such as the map 140 as described in FIGS. 1g, 1h and 1j. Based on the corresponding "full field" overlay map 140, in block 155, the corresponding values may be used as input values for a corresponding model for determining respective parameter values, as is for instance also explained with reference to block 153 of FIG. 1j. For example, the model as described with equation (1) may be used in combination with an appropriate optimization technique for obtaining the corresponding values of the alignment parameters.

In block 156, corresponding overlay error residuals, such as the residuals $e_x$, $e_y$ as explained with reference to equation (1), may be determined on the basis of the parameter values obtained in block 155 and the corresponding "full field" overlay data 140. Thus, the respective residuals obtained in block 156 may represent the corresponding overlay errors that may still be present after selecting "optimal" parameter values based on the corresponding input "measurement data" representing the contribution of the corresponding reticles and lithography tools used. Thus, in block 157, this "non-correctable" baseline of overlay errors may be superimposed on the corresponding "four corner" measurement positions, for instance by subtracting the corresponding residuals from the corresponding four corner overlay values, which may have been obtained on the basis of the overlay map 140, as is for instance described in FIG. 1j in block 151. Thus, modified "four corner" overlay values are obtained in which the corresponding intra field contribution is taken into account. Based on the corresponding modified "four corner" values of block 157, respective parameter values may be obtained in block 152A, which substantially corresponds to block 152 in FIG. 1j, wherein, however, the modified "four corner" data are used. Consequently, the corresponding parameter values obtained in block 152A may differ from the corresponding parameter values of block 152, since the corresponding intra field contributions are included to a higher extent compared to the parameter values of block 152. Thereafter, block 154, as also explained with reference to FIG. 1j, may be performed in order to obtain appropriate correction values, for instance respective differences of the corresponding parameter values of block 152A and of block 155. Thus, in this illustrative embodiment, the intra field components may be taken into consideration for the determination of the respective correction values with a reduced dependency on corresponding control algorithms, that is, on corresponding optimization techniques.

As a result, the subject matter disclosed herein provides an enhanced technique for controlling alignment processes to be performed when forming subsequent device layers of microstructure devices on the basis of a plurality of exposure tools and a plurality of reticles, wherein one or more reticles of the same type may be used for a respective first device layer and wherein one or more equivalent reticles may be used for the second device layer. While in conventional techniques, advanced APC strategies are typically performed on the basis of overlay measurement data having a moderately low spatial coverage of the corresponding exposure fields, since, for instance, only a few positioned within an exposure field may be subjected to measurement, wherein a damped moving average is used for trying to minimize the difference between the actually used parameter values and respective target values, the subject matter disclosed herein takes into consideration intra field effects caused by tool and reticle specific contributions by providing appropriate correction values for each of the alignment parameters. Since corresponding tool and reticle specific contributions may be relatively stable over time, respective measurements may have to be performed with low frequency, thereby not unduly increasing the overall measurement effort for obtaining the required intra field measurement data. In some illustrative embodiments, obtaining the respective measurement data having a high spatial coverage compared to standard measurement data based on conventional overlay marks may be obtained separately for the exposure tools under consideration and the respective reticles, thereby providing a high degree of flexibility with respect to process internal requirements in view of tool availability, reticle availability, introduction of new reticles and tools, changes in the tool configuration and the like. In other cases, a high degree of accuracy and reliability of the respective intra field measurement data may be accomplished by directly measuring interactions between the tool distortion signature and the corresponding intrinsic reticle characteristics. Hence, the respective mutual interactions may be represented with high accuracy, thereby also providing highly reliable correction values for the respective alignment parameters. During the alignment procedure, the standard measurement data may be received by the corresponding controller, which may additionally access a corresponding database for obtaining the corresponding correction values for the respective tool/reticle pairs that are involved in the formation of the corresponding device layers. Since the corresponding correction values may be available for any desired combination, even highly complex process situations may be covered by the corresponding database entries, wherein a high degree of flexibility is accomplished, since the corresponding database may be readily extended with respect to any new process situation, which may for instance occur when an additional reticle, a new exposure device and the like are introduced into the respective manufacturing environment. Since the corresponding determination of the respective parameter correction values may be substantially decoupled from the actual control process during a production situation, any negative influence on the performance of the control process with respect to operating speed may be substantially avoided. Consequently, on the basis of the respective correction values for the individual alignment parameters, the respective control algorithm may be modified by shifting the corresponding target values, wherein the corresponding shift or offset may represent the influence of the intra field contributions to the overlay errors and placement errors.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
generating overlay correction data for a plurality of different combinations of a first device layer and a second device layer of a microstructure device, said first device layer being defined by one or more first photomasks, said second device layer being defined by one or more second photomasks, said first and second device layers being formed by using a plurality of lithography tools, said overlay compensation data obtained from a first plurality of measurement positions within said first and second photomasks;
forming said first device layer on a first product substrate using one of said first photomasks and one of said plurality of lithography tools; and
aligning one of said second photomasks, used in one of said plurality of lithography tools, to said first device layer formed on said first product substrate by using said overlay correction data and an overlay measurement data obtained from a second plurality of measurement positions of a previously processed substrate having formed thereon said first and second layers, said second plurality of measurement positions being less than said first plurality of measurement positions.

2. The method of claim 1, wherein generating said overlay correction data comprises generating a respective placement data set for each of said first and second photomasks and generating an imaging distortion data set for each of said plurality of lithography tools.

3. The method of claim 2, wherein generating said respective placement data sets comprises providing a placement measurement mark at each of said first plurality of measurement positions.

4. The method of claim 2, wherein generating said imaging distortion data sets comprises determining a lens distortion signature for each of said plurality of lithography tools and determining residual placement errors for said lens distortion signature on the basis of an alignment model.

5. The method of claim 1, wherein generating said overlay correction data comprises forming said plurality of different combinations of first and second device layers by using different lithography tool/photomask pairs and measuring and measuring overlay data at each of said first plurality of measurement positions for each combination.

6. The method of claim 1, wherein generating said overlay correction data comprises determining an overlay map on the basis of said first plurality of measurement positions, determining estimated overlay data for said second plurality of measurement positions from said overlay map, determining a first set of alignment parameter values on the basis of said estimated overlay data, determining a second set of alignment parameter values on the basis of at least a portion of said overlay map, said portion providing a higher spatial coverage compared to said estimated overlay data, and obtaining said overlay correction data on the basis of said first and second sets of alignment parameter values.

7. The method of claim 6, further comprising generating a correction value for each alignment parameter on the basis of a difference of a value from said first set and a value thereof from said second set.

8. The method of claim 6, further comprising generating a correction value for each alignment parameter on the basis of a difference of said estimated overlay data and a residual overlay error determined on the basis of said overlay map, wherein said first set of alignment parameter values is determined on the basis of said difference.

9. The method of claim 1, wherein said overlay correction data determines an offset of a target value of an alignment parameter used as a manipulated variable for controlling said aligning of said second layer.

10. A method, comprising:
defining a map of overlay data for a plurality of lithography tool/reticle combinations for forming a first device layer and aligned thereto a second device layer of a microstructure device using respective two of said lithography tool/reticle combinations, said map being based on a first plurality of spatially distributed measurement positions;
obtaining overlay measurement data from a first product substrate having formed thereon said first and second device layers, said overlay measurement data being obtained from a second plurality of spatially distributed measurement positions, said second plurality being less than said first plurality; and
controlling aligning, with respect to said first device layer formed on a second product substrate using a first lithography tool/reticle combination comprising a reticle for said first device layer, of said second device layer to be formed by a second lithography tool/reticle combination comprising a reticle for said second device layer on the basis of said map of overlay data and said overlay measurement data.

11. The method of claim 10, wherein defining said map of overlay correction data comprises determining placement data for each reticle of said plurality of lithography tool/reticle combinations on the basis of placement measurement positions providing a higher spatial coverage compared to said second plurality of measurement positions, and determining a lens distortion signature for each lithography tool used.

12. The method of claim 11, further comprising determining a registration map for each of said reticles on the basis of said placement data.

13. The method of claim 12, further comprising determining residual placement errors on the basis of an alignment model and said lens distortion signatures and determining a distortion map on the basis of said residual placement errors.

14. The method of claim 13, further comprising combining said distortion map and said registration map for each of said lithography tool/reticle combinations to define said map of overlay data.

15. The method of claim 10, further comprising forming said first and second device layers for each possible one of said plurality of lithography tool/reticle combinations and measuring overlay data at least at said first plurality of measurement data and defining said map of overlay data on the basis of said measured overlay data.

16. The method of claim 10, wherein controlling said aligning comprises determining estimated overlay data for said second plurality of measurement positions from said map of overlay data, determining a first set of alignment parameter values on the basis of said estimated overlay data, determining a second set of alignment parameter values on the basis of at least a portion of said overlay map, said portion providing a higher spatial coverage compared to said estimated overlay data, and obtaining an overlay correction data on the basis of said first and second sets of alignment parameter values.

17. The method of claim 16, further comprising generating a correction value for each alignment parameter on the basis of a difference of a value from said first set and a value thereof from said second set.

18. The method of claim 16, further comprising generating a correction value for each alignment parameter on the basis of a difference of said estimated overlay data and a residual overlay error determined on the basis of said map of overlay data, wherein said first set of alignment parameter values is determined on the basis of said difference.

19. The method of claim 10, wherein said first device layer of said first substrate is formed using said first lithography tool/reticle combination and said second device layer of said first substrate is formed using said second lithography tool/reticle combination.

* * * * *